United States Patent [19]

Przybylski

[11] 3,991,323

[45] Nov. 9, 1976

[54] PULSE DURATION TO CURRENT CONVERTER

[75] Inventor: Frank J. Przybylski, Feasterville, Pa.

[73] Assignee: Honeywell Inc., Minneapolis, Minn.

[22] Filed: Mar. 19, 1975

[21] Appl. No.: 559,680

[52] U.S. Cl. .............................. 307/265; 307/230; 307/255; 307/297
[51] Int. Cl.² ...................... H03K 5/04; H03K 1/12
[58] Field of Search ........... 307/261, 297, 255, 265, 307/229; 328/140, 141, 132; 330/30 D

[56] References Cited
UNITED STATES PATENTS

| | | | |
|---|---|---|---|
| 3,435,252 | 3/1969 | Eubanks | 328/132 X |
| 3,564,444 | 2/1971 | Walsh | 330/301 D |
| 3,600,527 | 8/1971 | Blashfield | 328/140 |

*Primary Examiner*—Stanley D. Miller, Jr.
*Assistant Examiner*—B. P. Davis
*Attorney, Agent, or Firm*—Laurence J. Marhoefer; Lockwood D. Burton; Mitchell J. Halista

[57] ABSTRACT

A pulse duration to current converter wherein the output current is proportional to the duty cycle, or duration, of the input pulse. A first current source is modulated by an input signal while a second current source is held constant by an input reference signal level. The sum of the currents from the first and second current sources are averaged by a filter network to produce an output signal that is subsequently applied to the noninverting input of an amplifier to be amplified thereby. An output signal from the amplifier is converted to a current output by an output circuit driven by the amplifier. The output circuit will operate with maximum load impedances by using a level shifter at the input of the amplifier to shift the level of operation of the inverting input of the amplifier away from a power source level supplied to the amplifier. The level shifter includes a third current source wherein the gain of the amplifier is unaffected by the ratio of load impedance of the output transistor and the impedance of the third current source.

6 Claims, 1 Drawing Figure

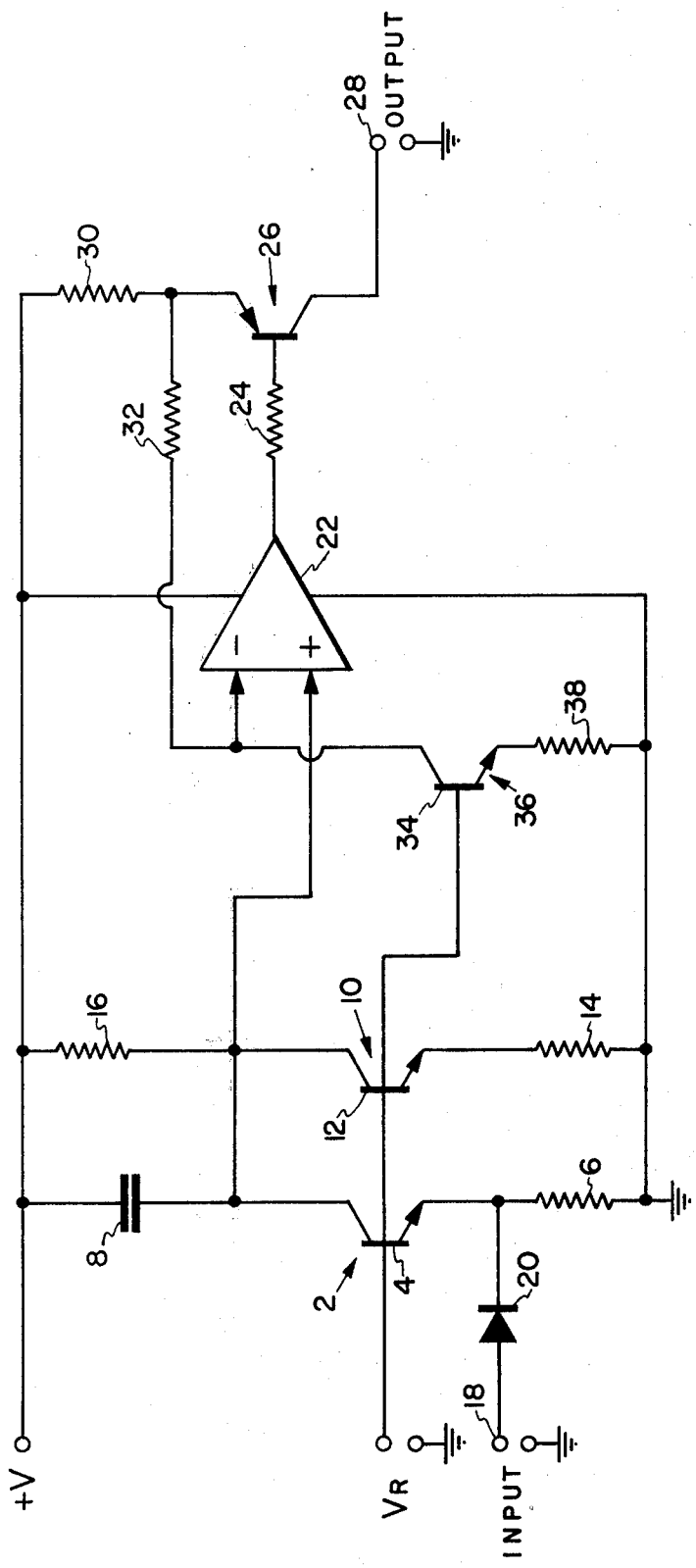

3,991,323

PULSE DURATION TO CURRENT CONVERTER

BACKGROUND OF THE INVENTION

Field of the Invention

The present invention relates to digital to analog converters. More specifically, the present invention is directed to a pulse duration to analog current converter.

SUMMARY OF THE INVENTION

An object of the present invention is to provide an improved pulse duration to analog current converter.

In accomplishing this and other objects, there has been provided, in accordance with the present invention, a pulse duration to analog current converter having a first and a second current source with reference signal means for concurrently driving the first and second current sources by a reference signal level. The first current source is additionally controlled by an input signal having a selectively variable duration. The output currents from the first and second current sources are summed and averaged to produce an input signal for the non-inverting input of an amplifying means. The amplifying means is arranged to produce an output signal for driving an output means having a transistor connected in an emitter follower configuration. The inverting input terminal of the amplifier is connected to an output signal from the output means and to a voltage level shifting circuit to shift the signal on the inverting input away from an energizing level for the amplifier whereby the load impedance for the output transistor can be maximized without producing non-linear operation of the amplifier.

BRIEF DESCRIPTION OF THE DRAWINGS

A better understanding of the present invention may be had when the following detailed description is read in connection with the accompanying drawing in which the single FIGURE is a schematic illustration of a pulse duration to analog current converter circuit embodying the present invention.

DESCRIPTION OF THE PREFERRED EMBODIMENT

Detailed Description

Referring to the single FIGURE drawing in more detail, there is shown a pulse duration to analog current converter circuit embodying the present invention and having a first current source 2 including a first transistor 4 with an emitter resistor 6 connected between the emitter of the transistor 4 and a common return and a capacitor 8 connected between the collector of the transistor 4 and a source +V. The base of the transistor 4 is connected to a source of reference voltage $V_R$. A second current source 10 includes a second transistor 12 having an emitter resistor 14 connected between the emitter of the second transistor 12 and the common, or ground, and a collector resistor 16 connected between the collector of the second transistor 12 and the source +V. The base of the second transistor 12 is also connected to the reference voltage source $V_R$. An input signal terminal 18 is connected through a diode 20 to the emitter of the first transistor 4 to modulate the output thereof. The collectors of the first and second transistors 4, 12 are connected together and to the non-inverting input terminal of an operational amplifier 22.

An output signal from the operational amplifier 22 is applied through an output resistor 24 to the base of a third transistor 26. The collector of the third transistor 26 is connected to an output terminal 28 while the emitter of the third transistor 26 is connected through a resistor 30 to the source +V. The emitter of the third transistor 26 is also connected through a resistor 32 to the inverting input of the operational amplifier 22 and to the collector of a fourth transistor 34. The fourth transistor 34 is arranged in a third current source circuit 36 with an emitter connected through a resistor 38 to the common, or ground, and the base connected to the source of the reference signal $V_R$. The operational amplifier 22 is also connected between the source +V and the common, or ground, connection to energize the circuit therein.

MODE OF OPERATION

The pulse duration to analog current converter shown in the single FIGURE drawing is operative to provide an output signal at the output terminal 28 which has an amplitude proportional to the duty cycle of the constant frequency input pulse applied to the input terminal 18. Specifically, the modulation of the current output from the first current source transistor 4 is summed with the output current from the second current source transistor 12 and averaged, or integrated, by the filtering network including the capacitor 8 and resistor 16 connected to the collectors of the first and second transistors 2 and 10. The voltage developed across the filter network resistor 16 is amplified by the amplifier 22 and is converted to a current output by the output transistor 26 and the emitter resistor 30.

In a conventional feedback amplifier circuit, the feedback resistor 32 is connected directly to the inverting input of the amplifier 22 and the current source 36 of the present invention is not used. In such a circuit, the voltage appearing at the emitter of the output transistor 26, i.e., the voltage drop across the output resistor 30 is applied to the inverting input of the amplifier 22. However, it is desired to minimize the size of the resistor 30 in order to maximize the output signal appearing across a load resistor (not shown) connected across the output terminals 28. On the other hand, the amplifier 22 has a minimum input signal characteristic represented by the amplitude difference between the signal applied to the inverting input and the energizing V source +V which is needed in order for the amplifier to operate in a linear region. Thus, the output resistor 30 must be maintained at a relatively large value in order to keep the feedback voltage at a suitable level below the +V source which value detracts, in turn, from the output signal level. The converter circuit of the present invention uses a level shifter to introduce a suitable voltage level at the inverting input of the amplifier 22 with respect to the source voltage +V while allowing the output resistor 30 to be a minimum value for maximizing the output voltage level. This level shifter includes the voltage dropping resistor 32 connected in the feedback path to the inverting input of the amplifier 22 and a current source 36 represented by the transistor 34 and the emitter resistor 38. This current source 36 draws a sufficient current through the resistor 32 to produce a voltage drop across the resistor 32 which further subtracts from the voltage appearing at the emitter of the output transistor 26. The voltage drop across the resistor 32 is effective to lower the voltage applied to the inverting input of the amplifier 22 below the source level +V by a sufficient amount to introduce a linear operation of the amplifier 22. Since the current source 36 has a theoretical infinite impedance, the impedance ratio between the resistor 32 and the current source 36 does not affect the gain of the amplifier 22. In this respect it is clear that a simple resistor could not be used in place of the current source 36 to achieve the benefits of the present invention since the impedance ratio would then lower the overall gain of the amplifier 22.

Accordingly, it may be seen that there has been provided, in accordance with the present invention, a pulse duration to analog current converter having a maximized output signal.

The embodiments of the invention in which an exclusive property or privilege is claimed are defined as follows:

1. A pulse duration to analog current converter comprising
    input signal means for integrating each pulse duration of an input signal,
    amplifier means for amplifying an output signal from said input signal means, said amplifier means having an inverting input and noninverting input,
    circuit means for applying an output signal from said input signal means to said noninverting input of said amplifier means,
    output means connected to an output of said amplifier means for producing an analog current in response to an output signal from said amplifier means,
    energizing means for energizing said output means and said amplifier means and
    level shift means connected between said output means and said inverting input of said amplifier means to increase the difference in level between an energizing signal from said energizing means and a signal applied to the inverting input of said amplifier means.

2. A converter as set forth in claim 1 wherein said output means includes a resistor and an output transistor having a base connected to the output of the amplifier means, a collector connected to an output terminal of said converter and an emitter connected to said energizing means through said resistor and to said level shift means.

3. A converter as set forth in claim 2 wherein said level shift means includes a current source having a first resistor, a second resistor and a transistor having a base connected to a constant signal source, a collector connected through said first resistor to said emitter of said output transistor and an emitter connected to a ground return of said energizing means though said second resistor.

4. A converter as set forth in claim 3 wherein said input signal means includes a second current source arranged to be controlled by the constant signal source connected to said transistor of said first-mentioned current source, a third current source arranged to be controlled by the constant signal source controlling said second current source and by the input signal applied to said input signal means.

5. A converter as set forth in claim 4 wherein said input signal means includes summing and integrating means for summing and integrating output signals from said second and third current source means to produce the output signal from said input signal means.

6. A converter as set forth in claim 5 wherein said integrating means includes an RC filter.

* * * * *